United States Patent
Robey

(10) Patent No.: US 11,194,371 B2
(45) Date of Patent: Dec. 7, 2021

(54) LIQUID COOLING SYSTEM

(71) Applicant: EKWB d.o.o., Komenda (SI)

(72) Inventor: Joe Robey, Derbyshire (GB)

(73) Assignee: EKWB d.o.o.

( * ) Notice: Subject to any disclaimer, the term of this patent is extended or adjusted under 35 U.S.C. 154(b) by 0 days.

(21) Appl. No.: 15/929,705

(22) Filed: May 18, 2020

(65) Prior Publication Data

US 2020/0363846 A1 Nov. 19, 2020

Related U.S. Application Data

(60) Provisional application No. 62/849,467, filed on May 17, 2019.

(51) Int. Cl.
*G06F 1/20* (2006.01)
*H05K 7/20* (2006.01)

(52) U.S. Cl.
CPC .......... *G06F 1/20* (2013.01); *H05K 7/20272* (2013.01); *G06F 2200/201* (2013.01)

(58) Field of Classification Search
CPC .......... H05K 7/20254; H05K 7/20272; H05K 7/20772; H05K 7/20781; H05K 7/20509; H05K 7/20809; G06F 1/20; G06F 2200/201

See application file for complete search history.

(56) References Cited

U.S. PATENT DOCUMENTS

| | | | | |
|---|---|---|---|---|
| 3,481,393 A * | 12/1969 | Chu | ........................ | F28F 3/12 165/80.4 |
| 6,111,749 A * | 8/2000 | Lamb | .................... | H01L 23/473 361/699 |
| 10,153,226 B1 * | 12/2018 | Zou | ........................ | H01L 23/427 |
| 10,178,803 B2 * | 1/2019 | Dixit | .................. | F28D 15/0275 |
| 10,602,640 B1 * | 3/2020 | Tsai | .................... | H05K 7/20254 |
| 10,631,438 B2 * | 4/2020 | Coteus | .............. | H05K 7/20254 |
| 2005/0128705 A1 * | 6/2005 | Chu | ........................ | H01L 23/473 361/699 |
| 2005/0231910 A1 * | 10/2005 | Malone | ............. | H05K 7/20772 361/695 |
| 2006/0187638 A1 * | 8/2006 | Vinson | ............... | H05K 7/20009 361/698 |
| 2013/0214406 A1 * | 8/2013 | Schultz | .............. | H01L 25/0655 257/713 |
| 2014/0347818 A1 * | 11/2014 | Uhlemann | ............ | H01L 23/473 361/699 |
| 2015/0131224 A1 * | 5/2015 | Barina | ...................... | G06F 1/20 361/679.53 |
| 2015/0160702 A1 * | 6/2015 | Franz | ....................... | G06F 1/20 361/679.47 |
| 2015/0173242 A1 * | 6/2015 | Blomberg | ............. | H01L 23/473 62/259.2 |

(Continued)

*Primary Examiner* — Adam B Dravininkas
(74) *Attorney, Agent, or Firm* — McGarry Bair PC

(57) ABSTRACT

A liquid cooling system is disclosed herein. The liquid cooling system contains one or more elements or components which provide for liquid cooling of heated or electronic environments, requiring heat dissipation. The liquid cooling system provides for creating a single looped assembly, which provides for a single-block system to cool all heat-producing components in an environment, which eliminates required fittings to complete the liquid cooling loop.

20 Claims, 22 Drawing Sheets

(56) References Cited

U.S. PATENT DOCUMENTS

| | | | |
|---|---|---|---|
| 2016/0165754 A1* | 6/2016 | Yu | H01L 23/473 165/104.33 |
| 2019/0259632 A1* | 8/2019 | Isaacs | H01L 23/473 |
| 2020/0042053 A1* | 2/2020 | Cheng | G06F 1/20 |

* cited by examiner

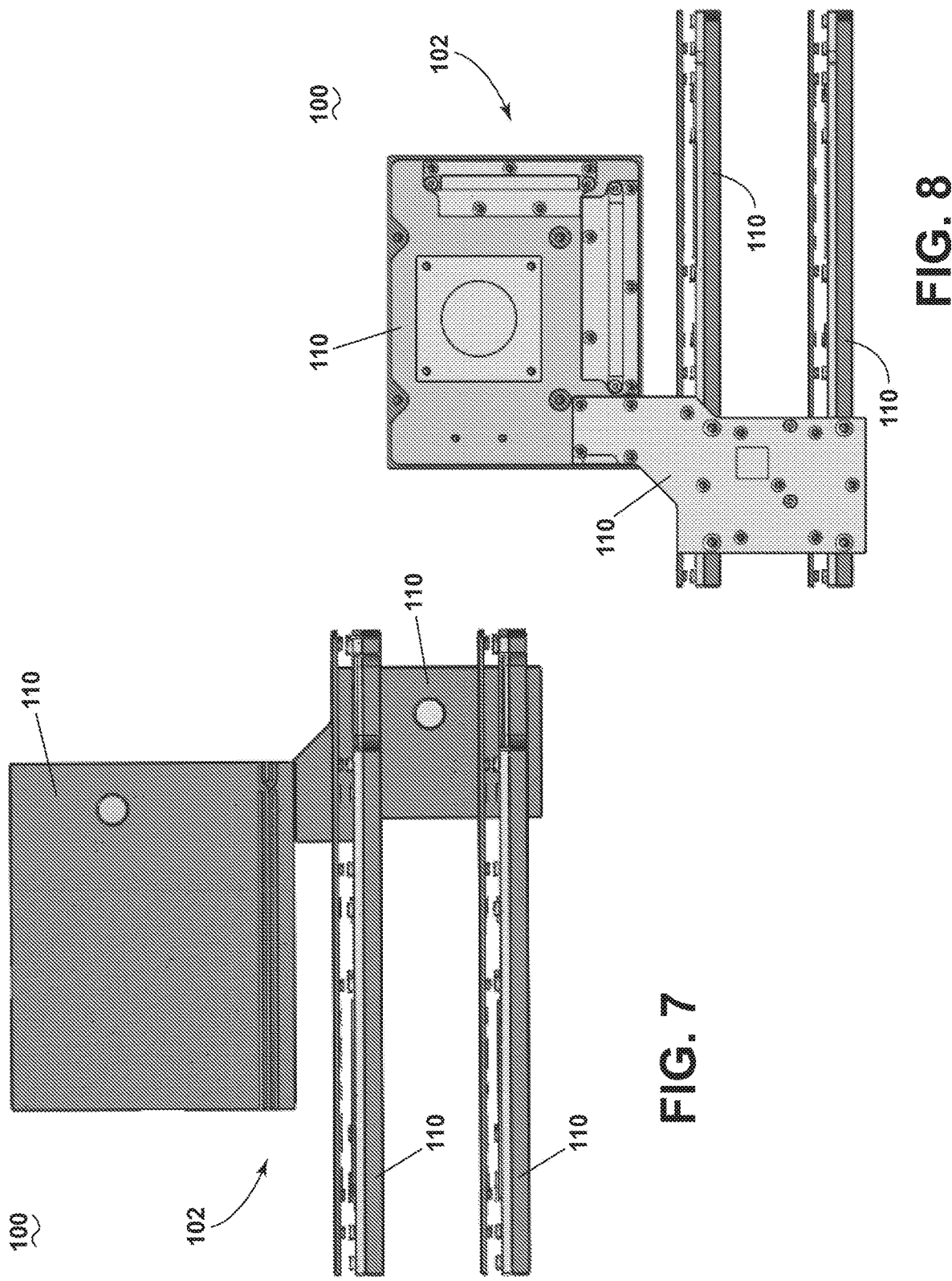

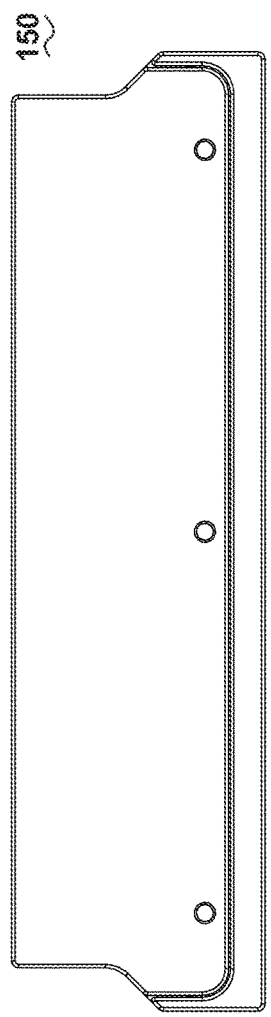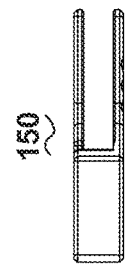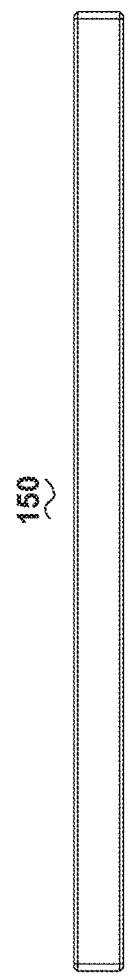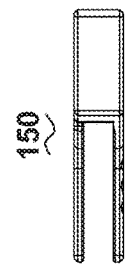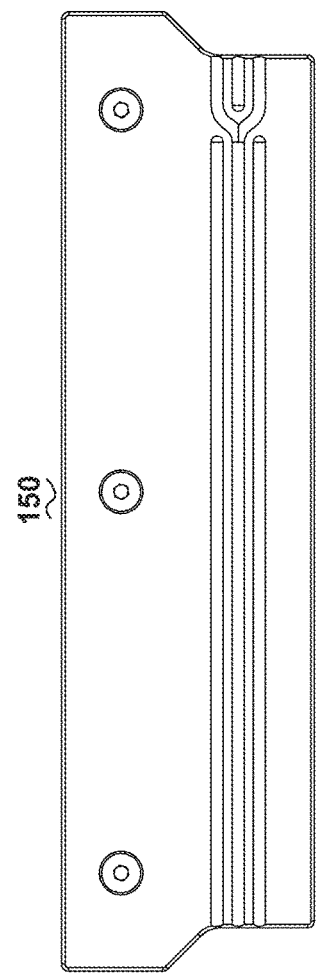

LIQUID COOLING SYSTEM

CROSS-REFERENCE TO RELATED APPLICATIONS

This application claims priority to and the benefit of U.S. Provisional Patent Application No. 62/849,467, filed on May 17, 2019, which is incorporated herein by reference in its entirety.

TECHNICAL FIELD OF THE INVENTION

This disclosure generally relates to liquid cooling systems for electrical or other heated or hot environments.

BACKGROUND

Liquid cooling systems can be comprised of a plurality of interconnected elements and fluid tubing, which can mount to one or more heated components to cooling and remove heat from said components. In order to fit the liquid cooling systems to the particular component setup, specialist knowledge and experience are required in order to achieve a suitable and consistent result. Specifically, there can be a significant number of fittings and seals to complete the liquid flow loop, which can be easily damaged, incorrectly selected, or even improperly used or installed. The significant number of such elements increases the opportunity for leakage or improper operation, which can result in damage to the environment the cooling system is intended to cool.

Furthermore, a fluid loop must be achieved to provide for continuous movement of a cooling liquid, as well as securely mounting the system without excessive deflection or damage to the component due to weight of the liquid cooling system. Often, an individual liquid cooling unit is mounted and dedicated, to each heat producing component, such as one circuit board or microprocessor having its own dedicated liquid cooling assembly fastened only to that component. Such as system often exceeds the size and weight limitations of the particular component or local area in the heated environment.

BRIEF SUMMARY

A liquid cooling system with a liquid cooling loop including and integrating securing multiple cooling blocks into the single liquid cooling system.

In one aspect, the disclosure relates to a modular liquid cooling system for cooling electronic components comprising: at least two blocks, with each block including: a body; a fluid conduit extending through the body including an inlet and an outlet; and a structural interface provided on the body at one of the inlet or the outlet, the structural interface connecting the body to another block of the at least two blocks; wherein the structural interface provides for both structural connection and fluid communication among the at least two blocks.

In another aspect, the disclosure relates to a method of liquid cooling an electronic device, the method comprising: providing a first block of a modular liquid cooling system including a first conduit; connecting at least a second block of the modular liquid cooling system to the first block, with the second block including a second conduit; and passing a liquid from the first conduit to the second conduit at the connection between the first block and the second block; wherein the liquid convectively cools the electronic device by passing the liquid among the first conduit and the second conduit.

In yet another aspect, the disclosure relates to a block for a modular liquid cooling system, the block comprising: a body; a fluid conduit extending through the body including an inlet and an outlet; and a structural interface provided on the body at the inlet and the outlet, the structural interface configured to fluidly couple the fluid conduit and physically connect the body to another block.

BRIEF DESCRIPTION OF THE DRAWINGS

In the drawings:

FIG. 7 is another view of the liquid cooling system of FIG. 6.

FIG. 8 is a bottom view of the liquid cooling system of FIG. 1.

FIG. 16A is a top view of a component for a liquid cooling system.

FIG. 16B is a front view of the component of FIG. 16A.

FIG. 16C is a bottom of the component of FIG. 16A.

FIG. 16D is a left side view of the component of FIG. 16A.

FIG. 16E is a right side view of the component of FIG. 16A.

DETAILED DESCRIPTION

Aspects of the present disclosure relate to a liquid cooling system for cooling electrical component, such as those in an industrial computer setting. While the description herein will be directed toward a liquid cooling system in the industrial computer setting, it should be appreciated that the cooling system can have applicability in other environments, such as that of any electrical device or component, as well as in those areas which require localized cooling, often in compact or tight-fit environments requiring significant heat dissipation.

Figure 1:
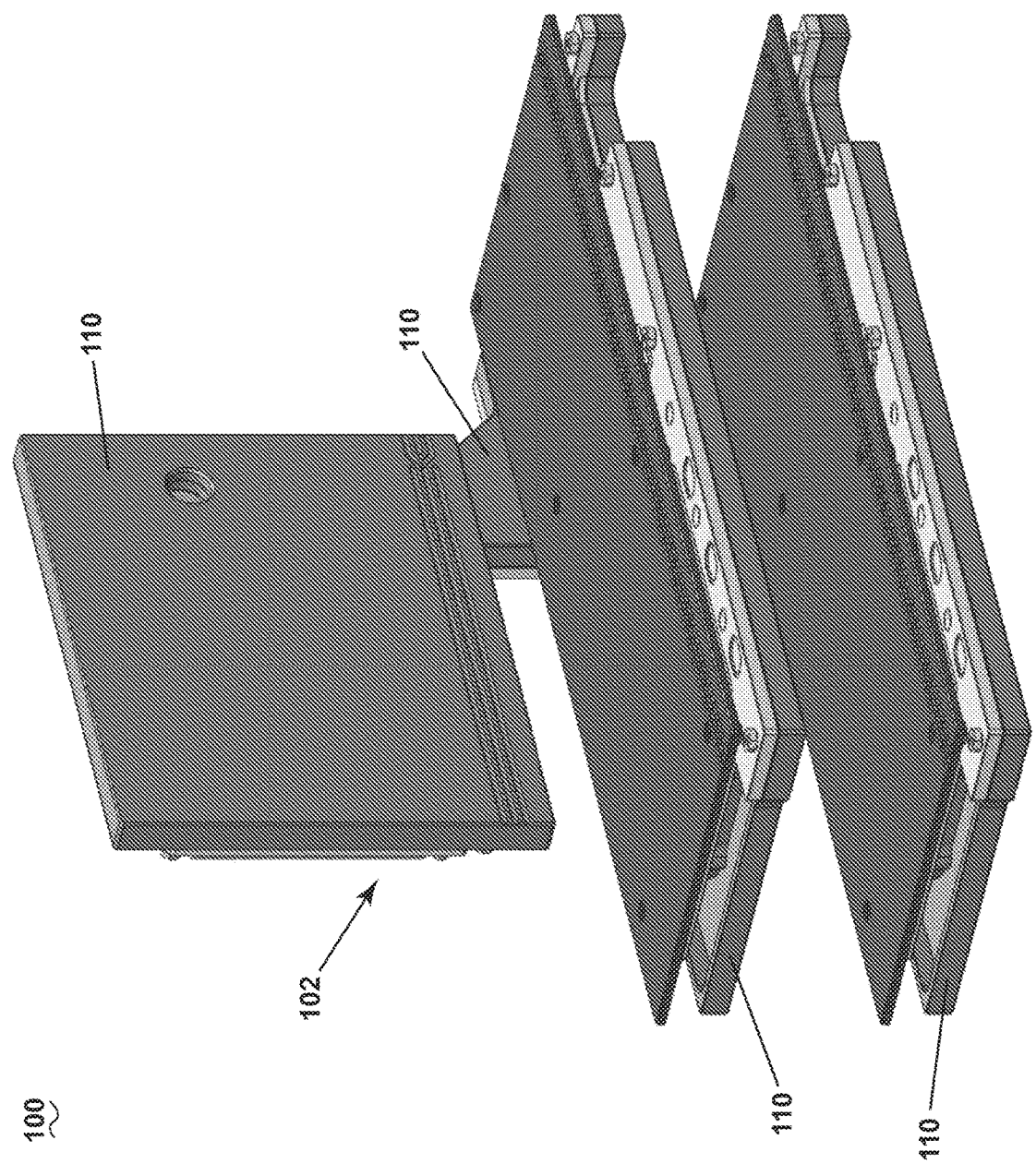
FIG. 1 is a front, top perspective view of the liquid cooling system.
Figure 2:
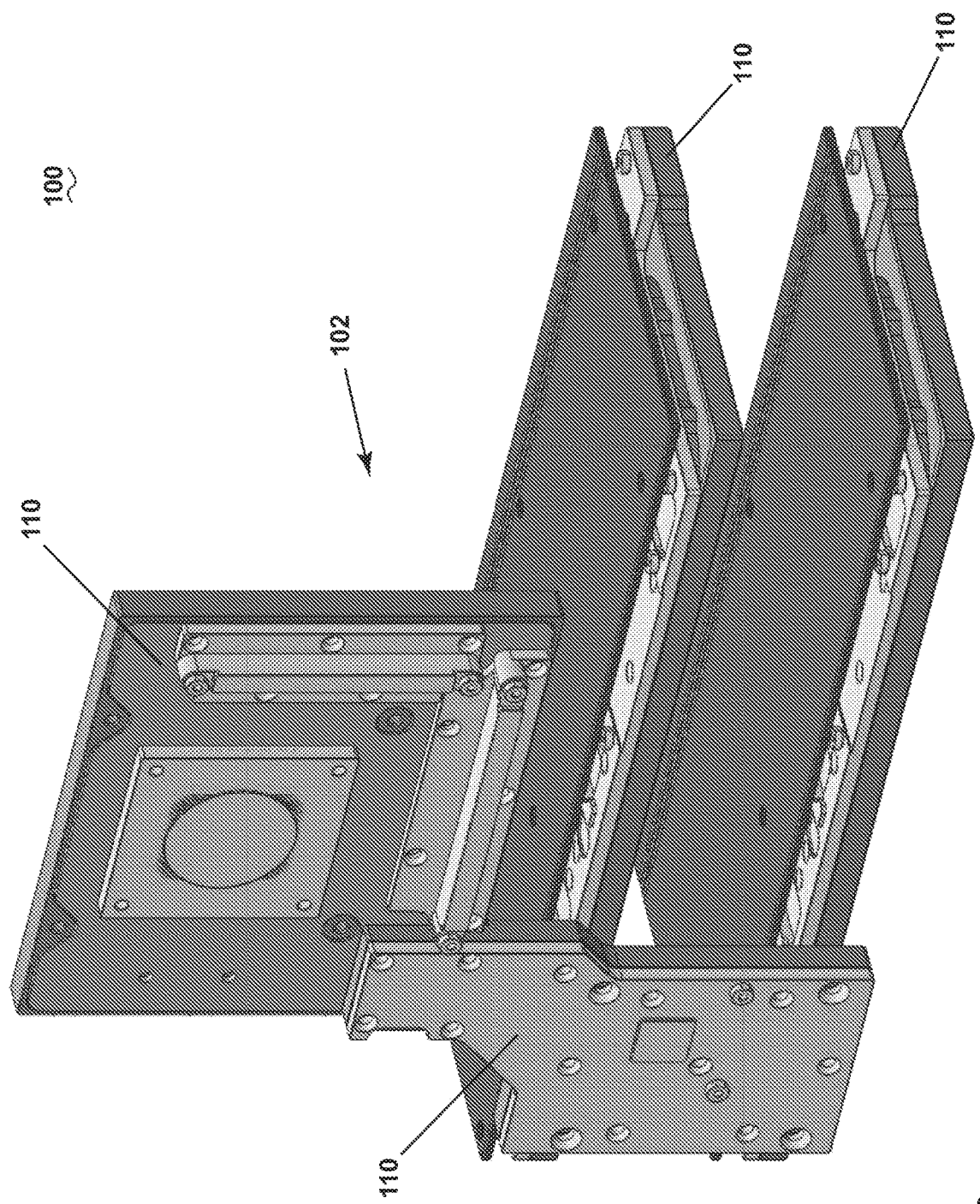
FIG. 2 is a rear, top perspective view of the liquid cooling system of FIG. 1.
Figure 3:
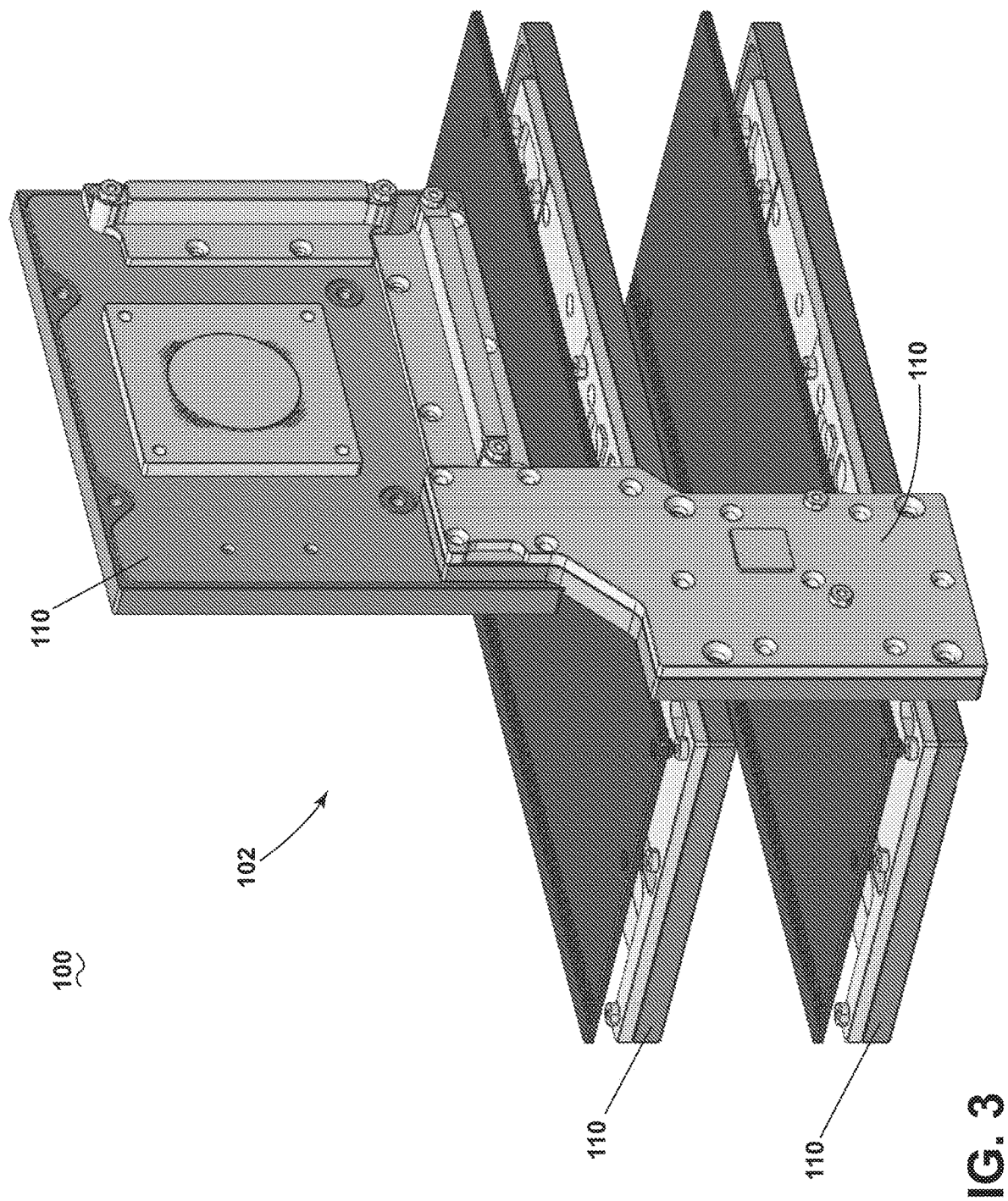
FIG. 3 is an alternate rear, top perspective view of the liquid cooling system of FIG. 2.
Figure 4:
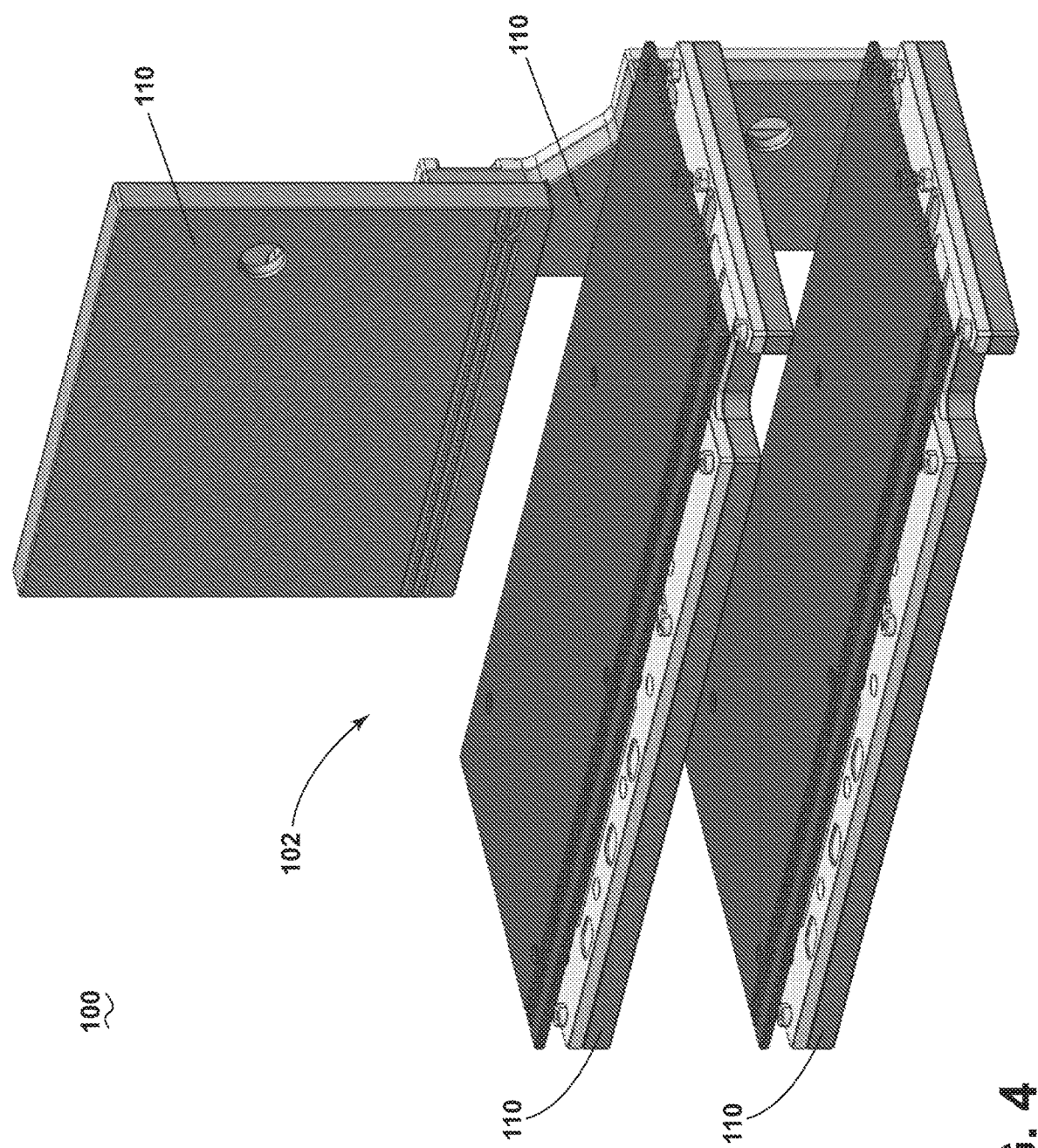
FIG. 4 is an alternate front, top perspective view of the liquid cooling system of FIG. 1.
Figure 5:
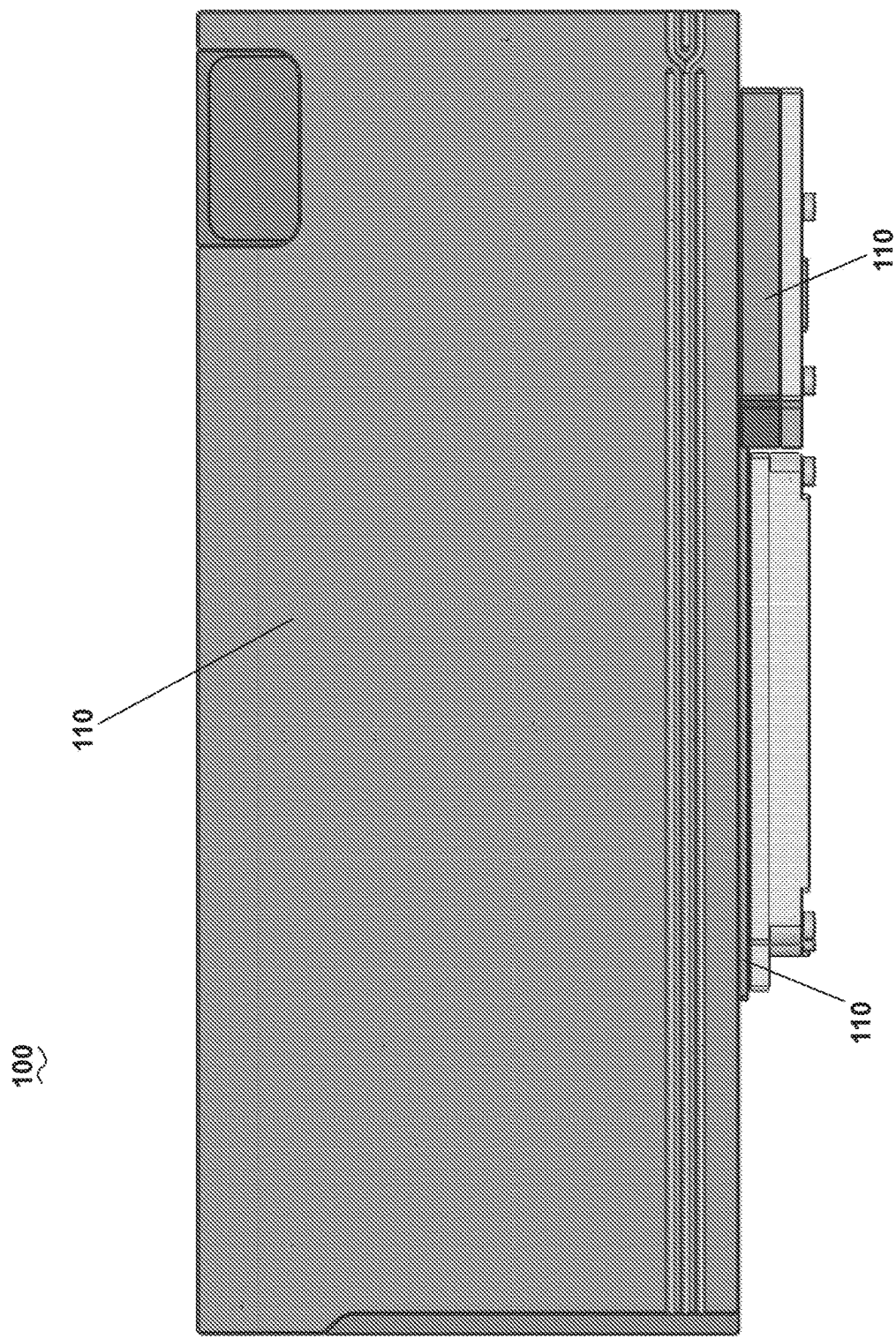
FIG. 5 is a bottom view of the liquid cooling system of FIG. 1.
Figure 6:
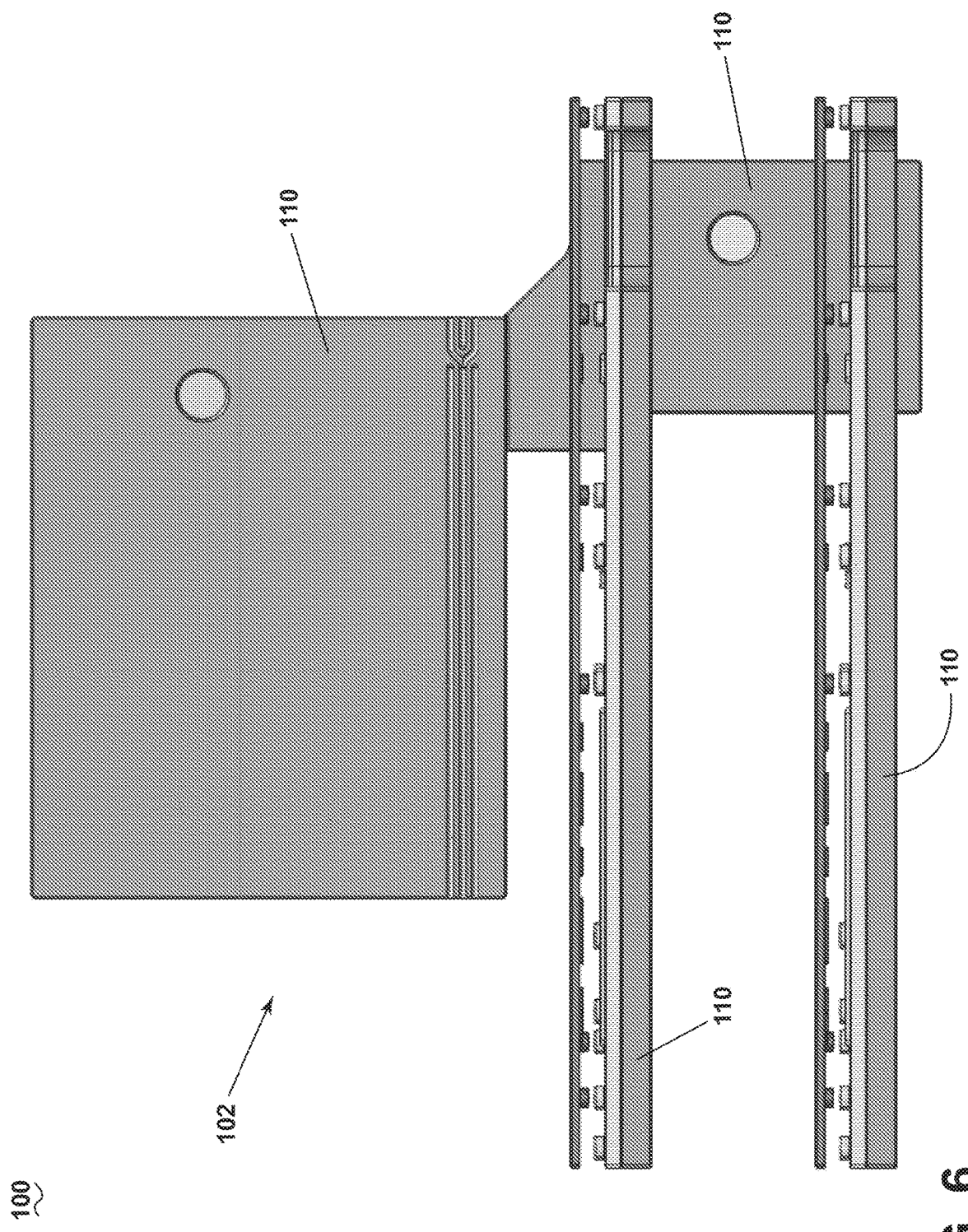
FIG. 6 is a front view of the liquid cooling system of FIG. 1.
Figure 9:
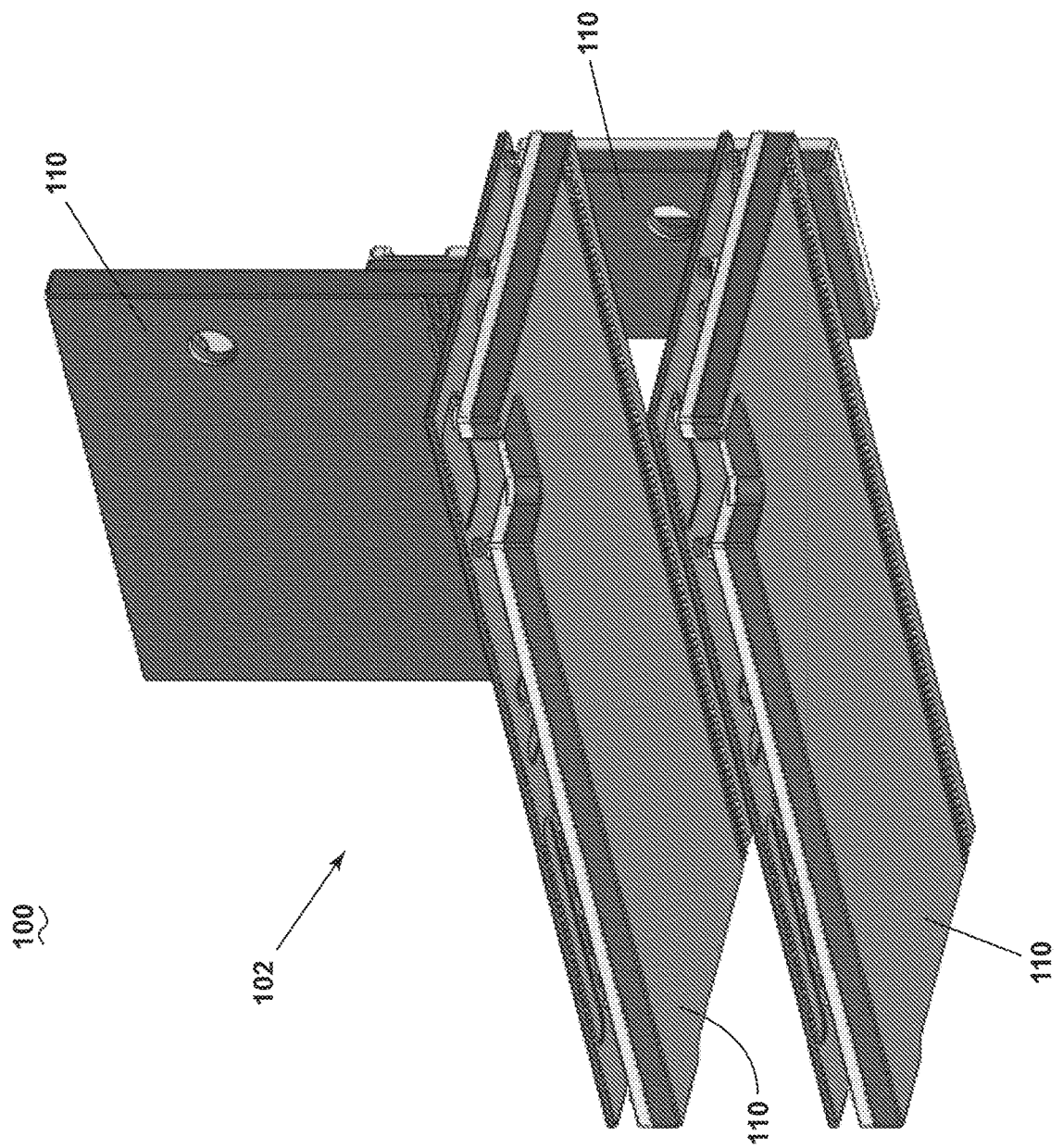
FIG. 9 is a bottom perspective view of the liquid cooling system of FIG. 1.
Figure 11:
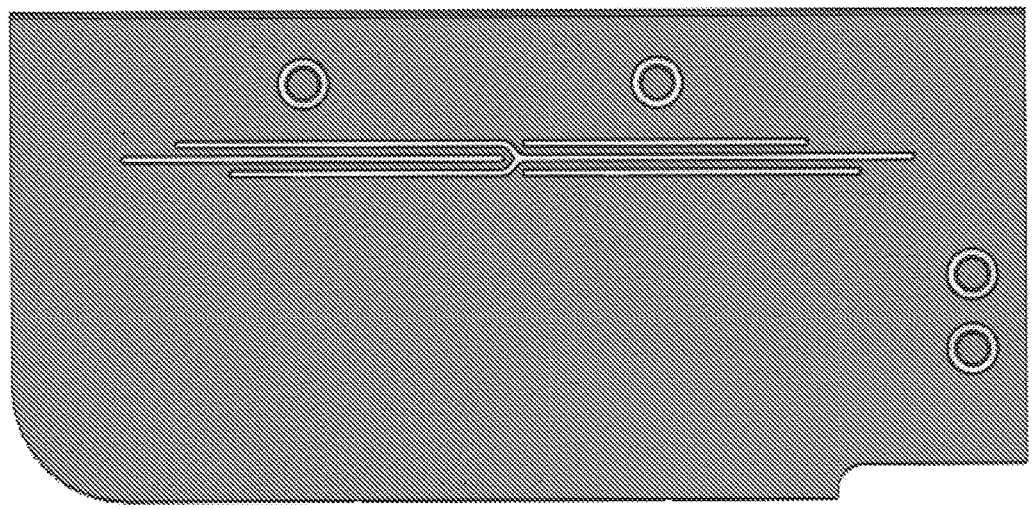
FIG. 11 is a top view of a component for the liquid cooling system of FIG. 1.
Figure 10:
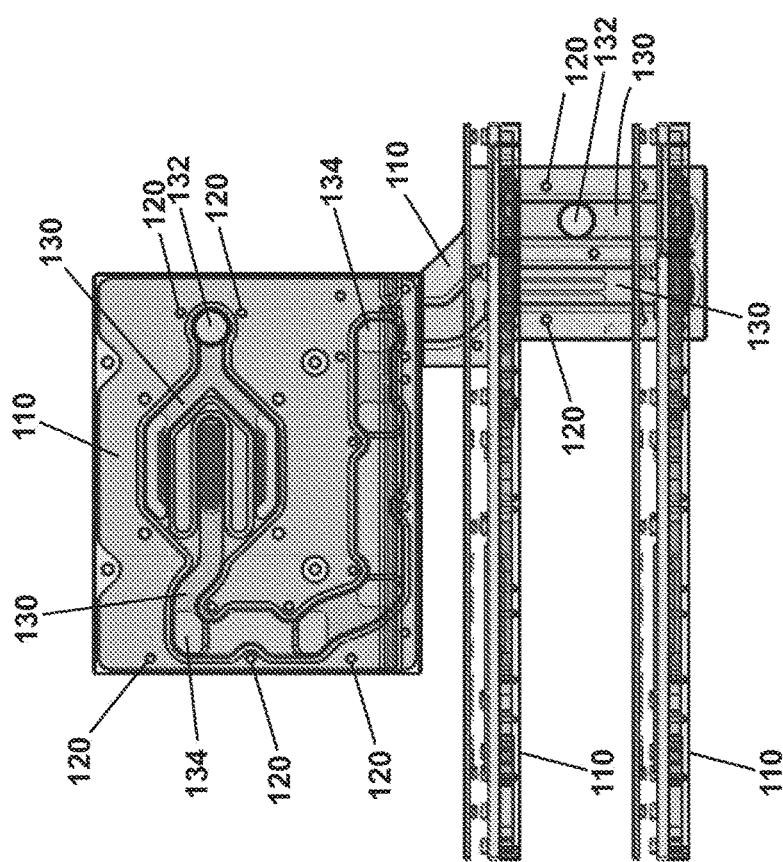
FIG. 10 is a sectional view of the liquid cooling system of FIG. 1.
Figure 13:
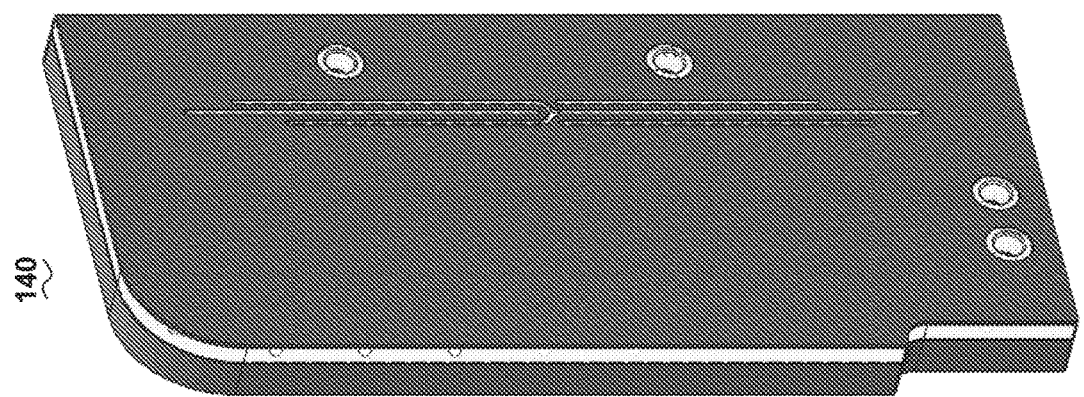
FIG. 13 is a perspective view of the component for the liquid cooling system of FIG. 12.
Figure 12:
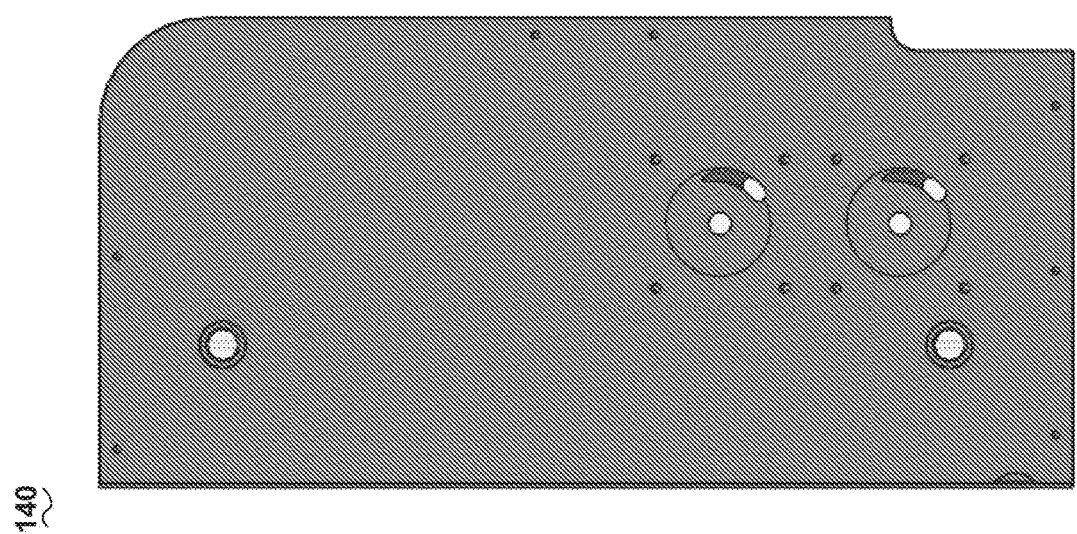
FIG. 12 is a bottom view of the component for the liquid cooling system of FIG. 11.

For purposes of description related to the figures, the terms "upper," "lower," "right," "left," "rear," "front," "vertical," "horizontal," and derivatives thereof shall relate to the invention as oriented in FIG. 1. However, it is to be understood that aspects of the present disclosure may assume various alternative orientations, except where expressly specified to the contrary.

FIGS. 1-10, 15A-15E, and 19-24 include a liquid cooling system 100. The liquid cooling system 100 includes a set of rigidly secured blocks 110, each having a body, to form a single liquid cooling assembly 102 capable of providing a cooling fluid among the liquid cooling system 100 for cooling electrical components. The blocks 110 can be arranged and interconnected substantially perpendicular, parallel, or otherwise, such that the loop passing the cooling fluid is contained internal of the liquid cooling system 100, and capable of flowing among the loop for cooling an entire system of electrical or heated elements.

The liquid cooling system 100 includes structural interfaces 120 among the different blocks 110, which provides for both connection and fluid communication to distribute cooling among the blocks 110. In this way, the liquid cooling system 100 can cover the whole heat producing environment in a self-contained manner, while maintaining a rigid mounted structure. While shown as a set of secured blocks 110, it should be understood that more or less blocks can be used, added, or connected to tailor the liquid cooling system 100, or the loop defined therein, to the particular heated environment. As such, the liquid cooling system 100 can be considered a modular system, which is interconnected into a single operably assembly that contains the loop for passing the cooling fluid.

In operation, a liquid is provided within and among the block which when passed through the blocks 110, which draws heat from the electrical components of the system that the liquid cooling system cools. The liquid can be provided among the liquid cooling system 100, or the blocks 110 thereof, by fluidly coupling the blocks together and passing the liquid among the blocks. The liquid convectively draws heat from electrical components adjacent the blocks 110, through the blocks 110, where the liquid can be cooled to release the heat. Such effectively cools the hot electrical components. The liquid can be continuously pumped among the blocks 110, such as with a pump, as well as continuously cooled, so that continuous cooling of the electrical components can be achieved. Systems or devices for cooling or removing heat from the liquid (after removing the heat from the electrical components) can include in non-limiting examples, cooling the liquid, such as with a cooling system that uses refrigerant, or by other means such as fans blowing on portions of the blocks 110 to remove heat from the system via additional convection.

The views of FIGS. 10, 21, and 23-24 illustrate exemplary interior fluid conduits 130, each conduit 130 having an inlet and outlet as defined by the flow direction through the block 110. The structural interfaces 120 can be provided adjacent to, near, or integrated with the inlets or outlets of the fluid conduits 130, which provide for securing fluid conduits 130 among multiple blocks 110 when fastening the multiple blocks 110 at the structural interfaces 120. In this way, the conduits 130 and structural interfaces 120 provide for forming a loop among each block 110, as well as among the entire liquid cooling system 100. In this way, the connection of the blocks 110 at the structural interfaces 120 both mounts and fluidly couples the fluid conduits 130.

It should be appreciated that not all structural interfaces 120 or fluid conduits 130 need to be used in the completed liquid cooling assembly 102. In such a case, the inlets and outlets of the fluid conduits 130 can be sealed or closed, preventing any fluid from either entering or exiting the interfaces 120 or conduits 130 that are not in use. Furthermore, the multiple interfaces 120 and conduits 130 can provide for forming a myriad of different modular liquid cooling systems 100, without requiring particular tailoring to the electronic or heat-generating environment.

Figure 20:
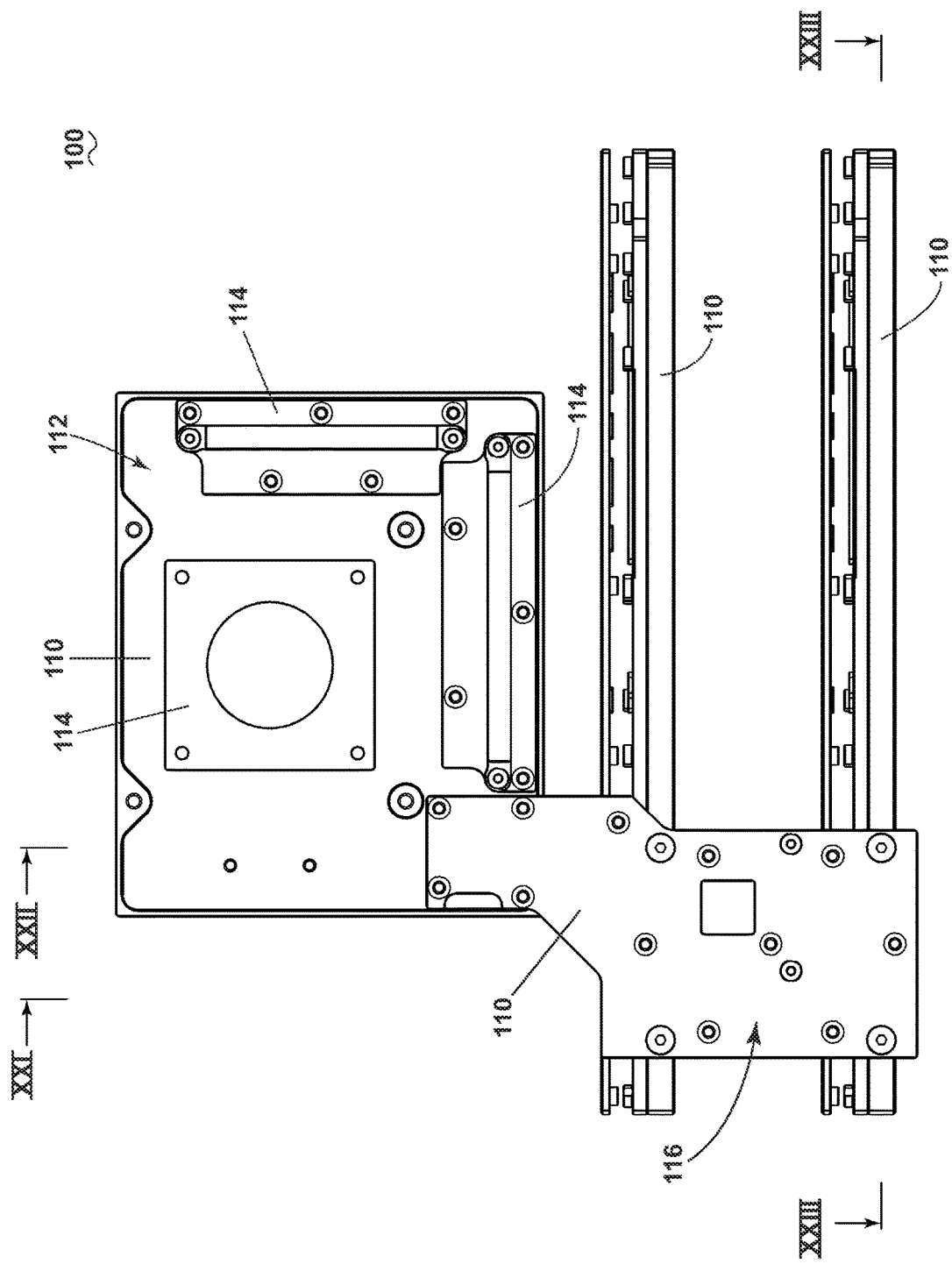
FIG. 20 is a rear view of a liquid cooling system.
Figure 21:
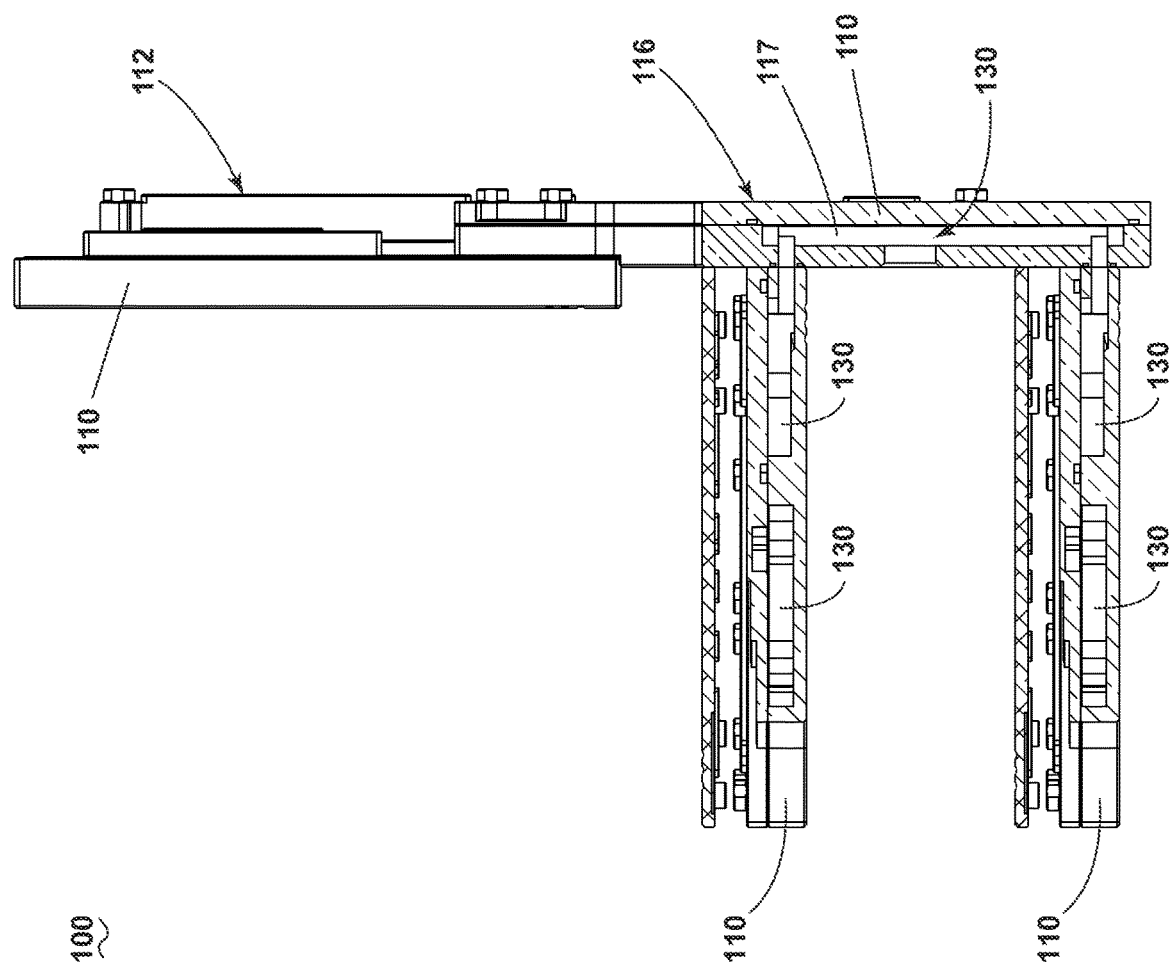
FIG. 21 is a section view of the liquid cooling system of FIG. 20, taken across section XXI-XXI.
Figure 22:
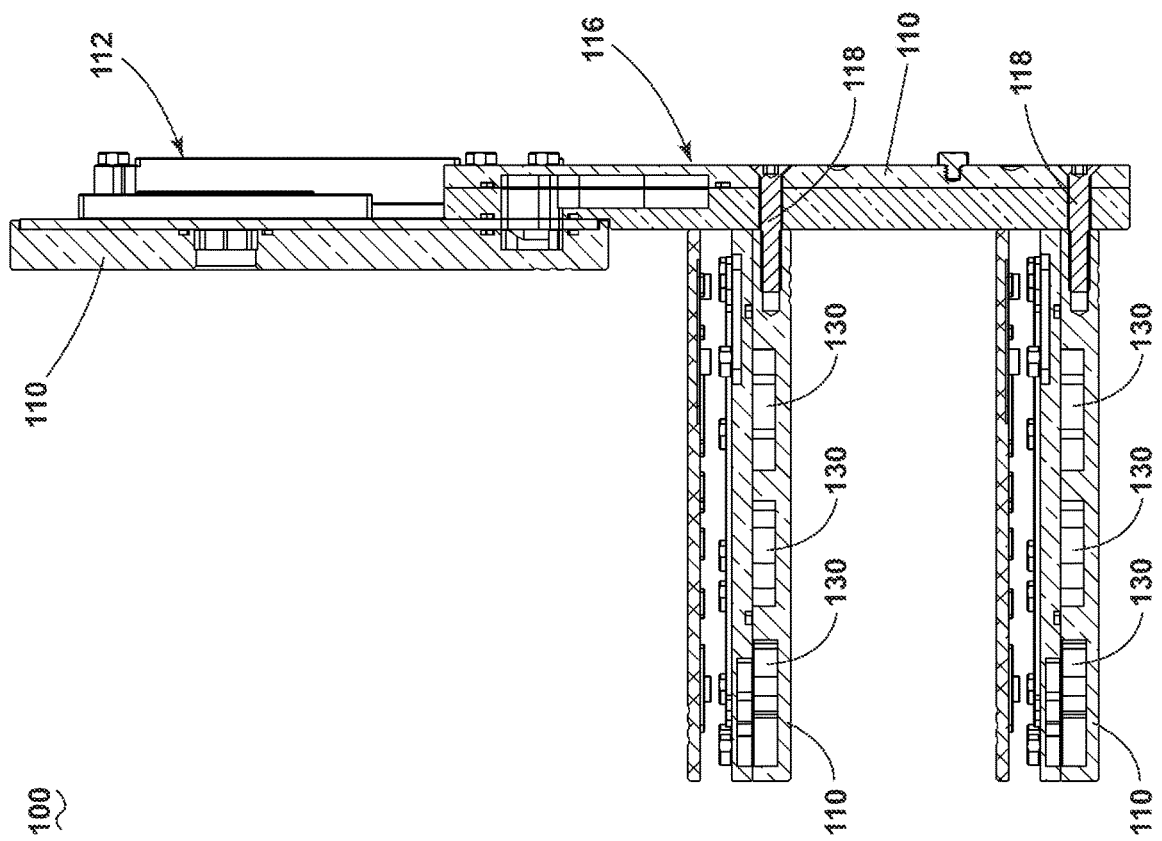
FIG. 22 is another section view of the liquid cooling system of FIG. 20 taken across section XXII-XXII.
Figure 23:
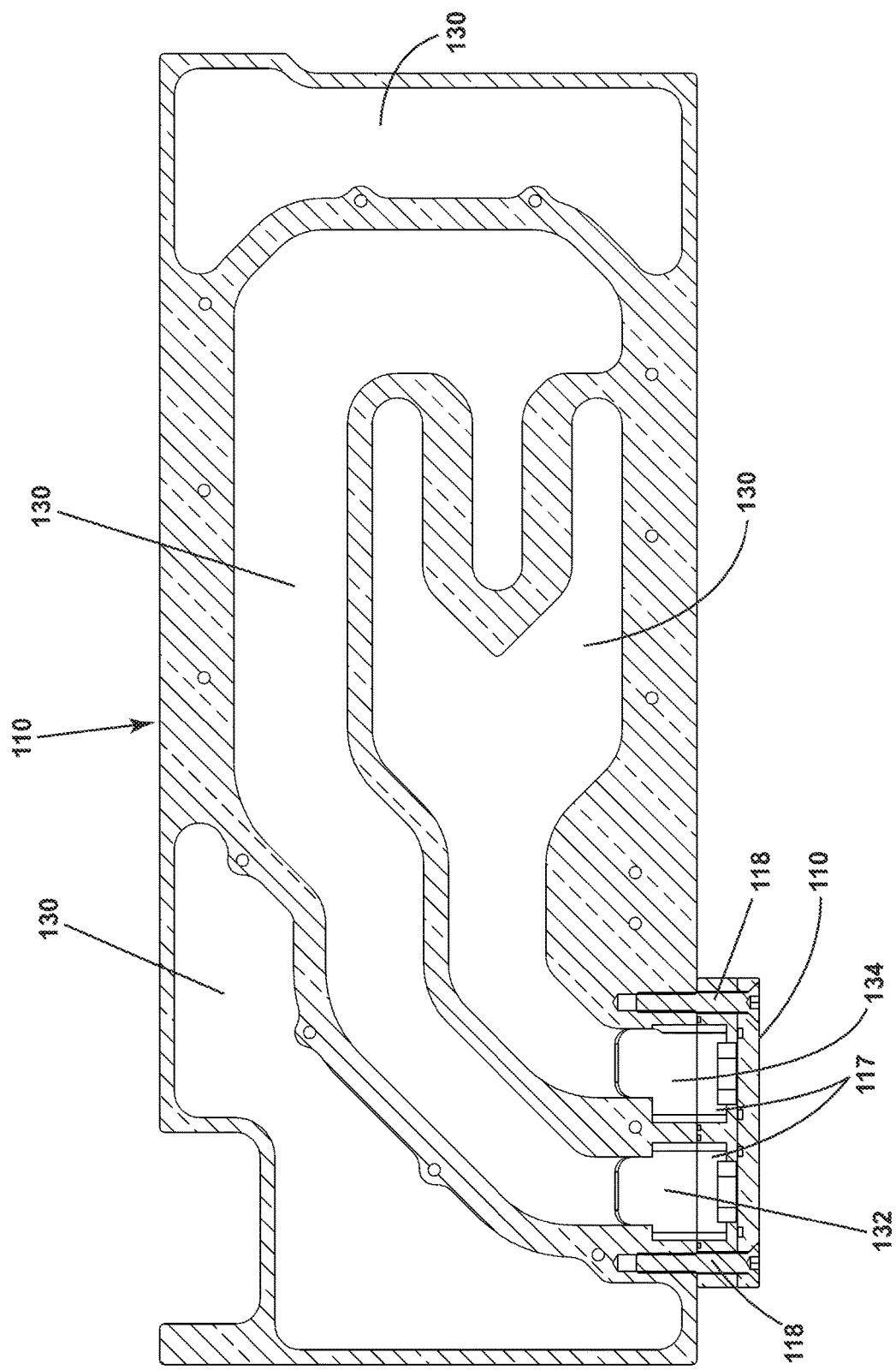
FIG. 23 is another section view of the liquid cooling system of FIG. 20 taken across section XXIII-XXIII
Figure 24:
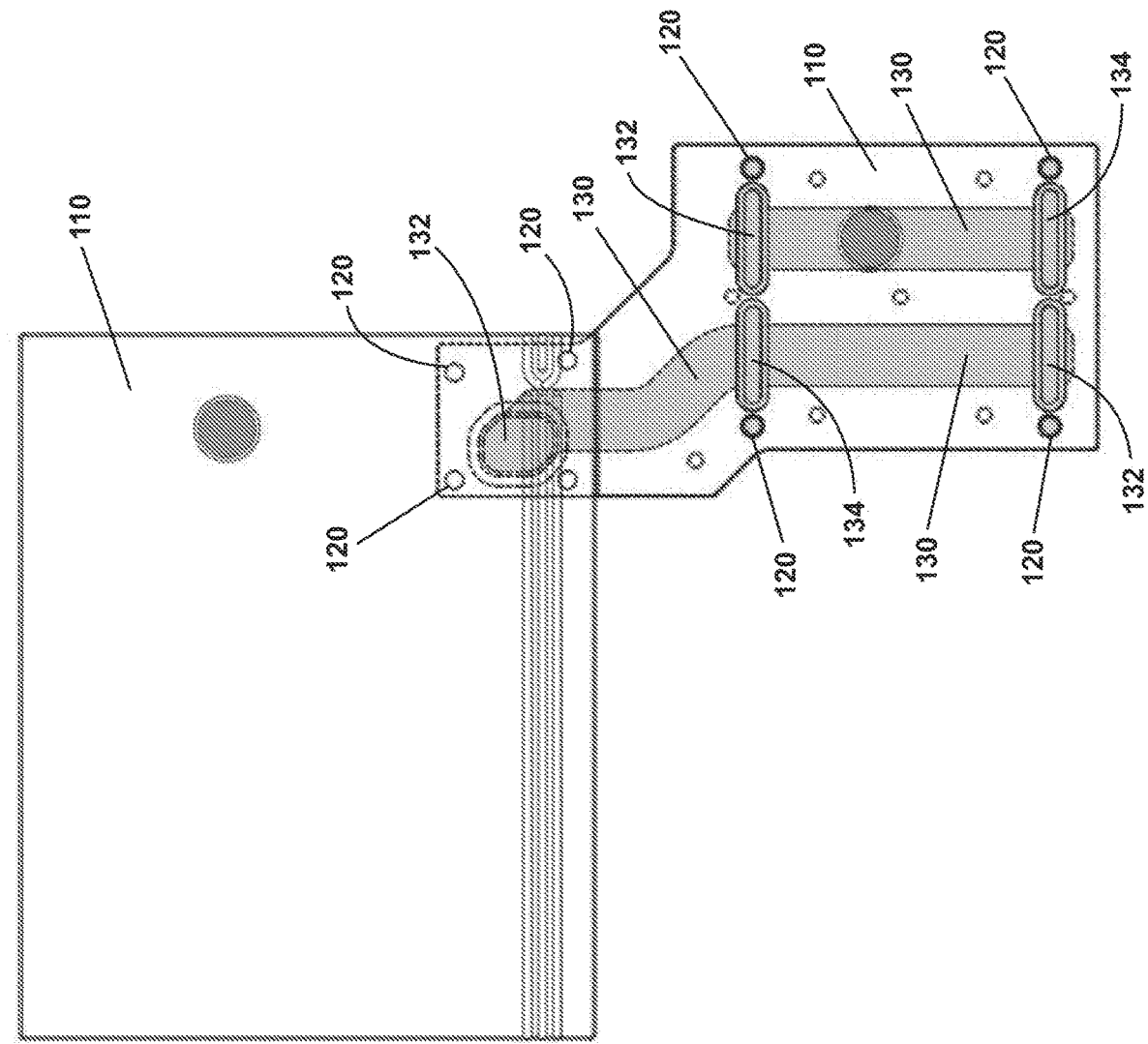
FIG. 24 is yet another view of a liquid cooling system showing interior fluid conduits.

Referring now to FIG. 20 specifically, one particular example in the environment of a personal computer system, the base for the solution is comprised of a primary block 112, such as having has individual cold plates 114 for the CPU and VRM arrays. In addition, a terminal block 116 is included which can be arranged alongside the PCIe slots, for example, with upward facing ports 117 (best seen in FIG. 21). These ports 117 can connect to graphics cards or other PCIe based devices, and can be sealed by rubber O-Rings or other suitable seals or gaskets in the mating faces, for example. See FIG. 21. In order to apply pressure between these mating faces and compress the O-Rings there are screws 118 orientated perpendicular to the motherboard section of the block. Such screws 118 are shown in the sectional view of FIG. 22.

The screws 118 can be determined such that they can easily support the weight of the entire assembly in order to minimize the occurrence of component deflection. One installation example for assembling the blocks 110 with all components includes that first the GPU blocks are installed to the graphics card(s). Then the GPU blocks are assembled onto the motherboard block and lastly the motherboard can be installed onto the other components to complete the assembly both physically and electronically.

Each physically different graphics card and block 110 on the market would require its own specific block 110, however, the interface between the blocks 110 would be the same, such that the assembly is modular and any graphics card (or other component) could be used with any motherboard (or another component). It is also possible and contemplated to use a different number of graphics card blocks, or arranging graphics card blocks in various positions; or other blocks non-specific to graphics cards. For example, other PCIe devices such as RAID controllers and SSD's could also interface with the solution.

The unified interface would preferably be based around the currently existing ATX and PCIe physical specifications allowing for electronic, mechanical and coolant connections to be made simultaneously. The terminal element of the motherboard block has two manifolds allowing for inlet and outlet coolant ports to the PCIe devices as required. However, the interfaces and liquid cooling systems 100 could easily be generated and adapted for other electronic or hot environments different from specific ATX or PCIe requirements. Additional non-limiting examples of PCIe devices can include a hard drive, a network card, a graphics card, or any other peripheral device which can be connected to a motherboard or within a computer hardware setting.

One novel aspect is that the system 100 allows for some degree of modularity, such as if the graphics card blocks are configured with parallel flow. This means only one or multiple blocks can be added and they will all have the same flow direction; the remaining ports can simply be covered over.

Also, inside the terminal element, coolant can be routed over the motherboard chipset, providing additional active cooling to the motherboard or other components thereon, with need only for an additional contact area.

Figure 14:
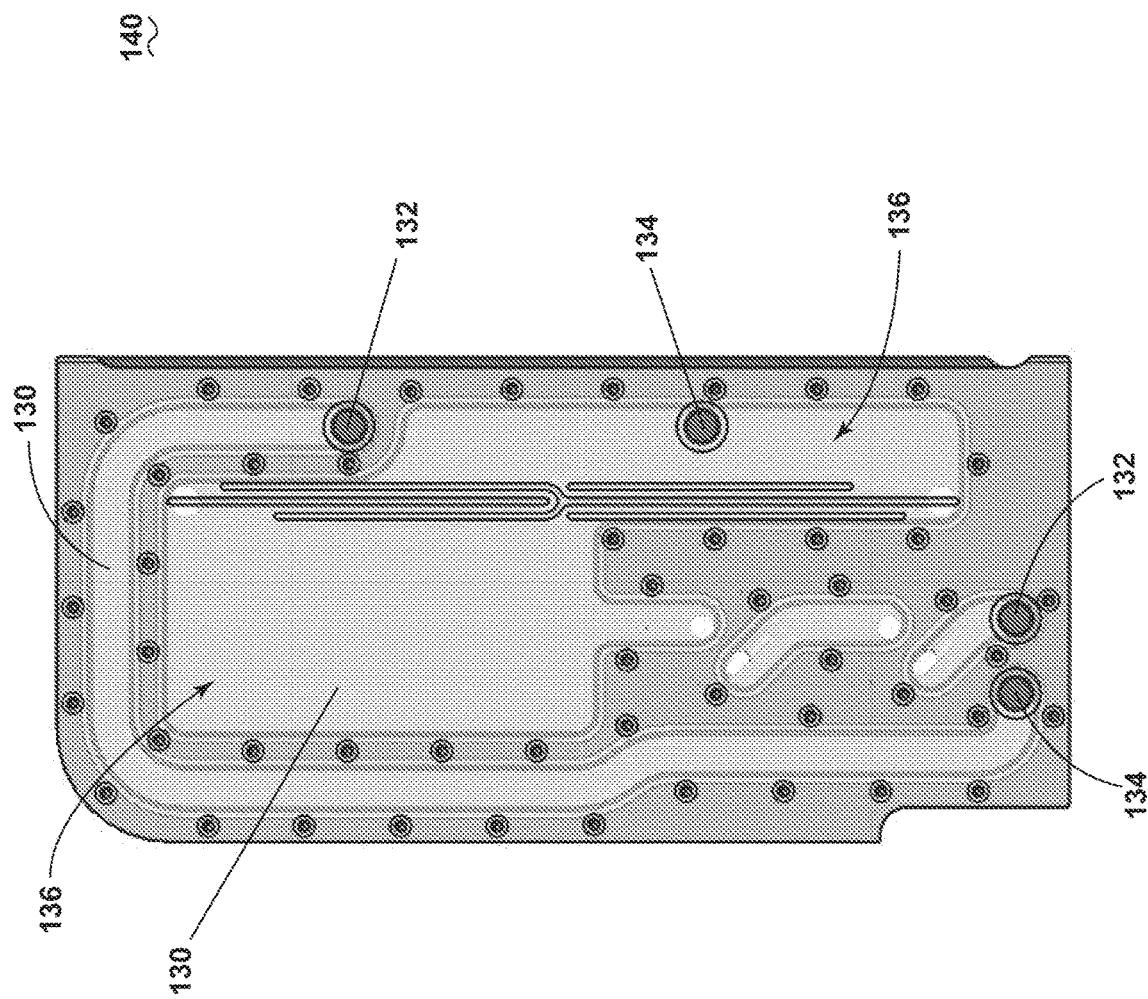
FIG. 14 is a sectional view of the component for the liquid cooling system of FIG. 13.
Figure 15B:
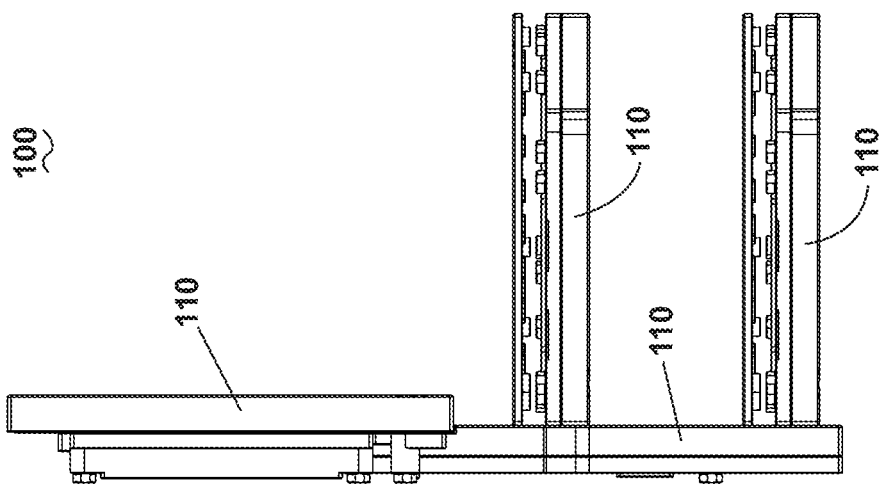
FIG. 15B is a side view of the liquid cooling system of FIG. 15A.
Figure 15A:
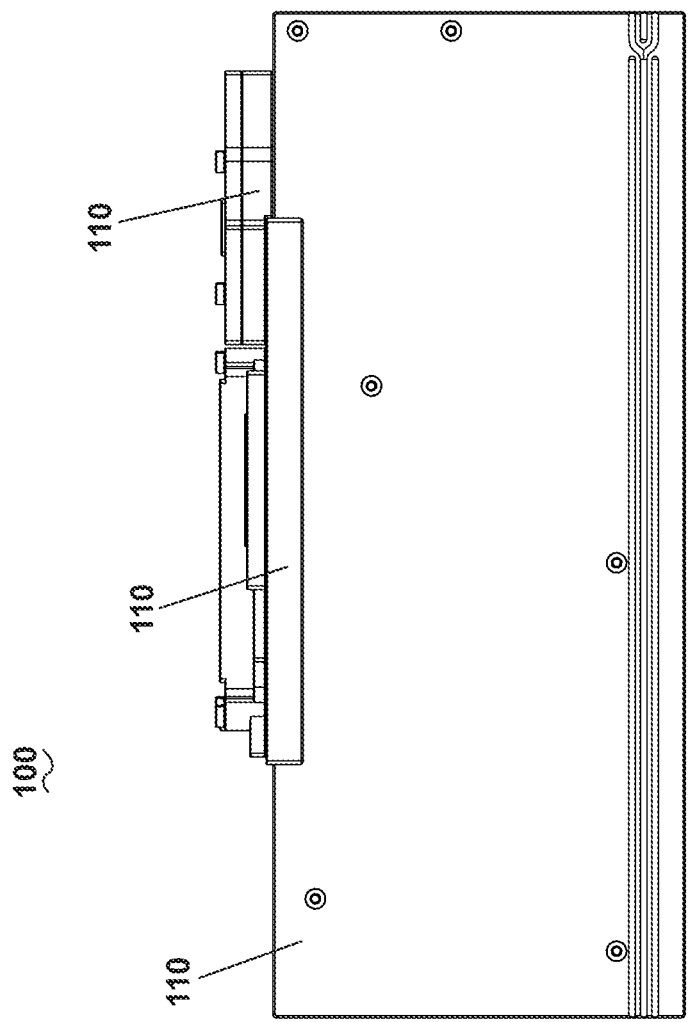
FIG. 15A is a top view of a liquid cooling system.
Figure 15D:
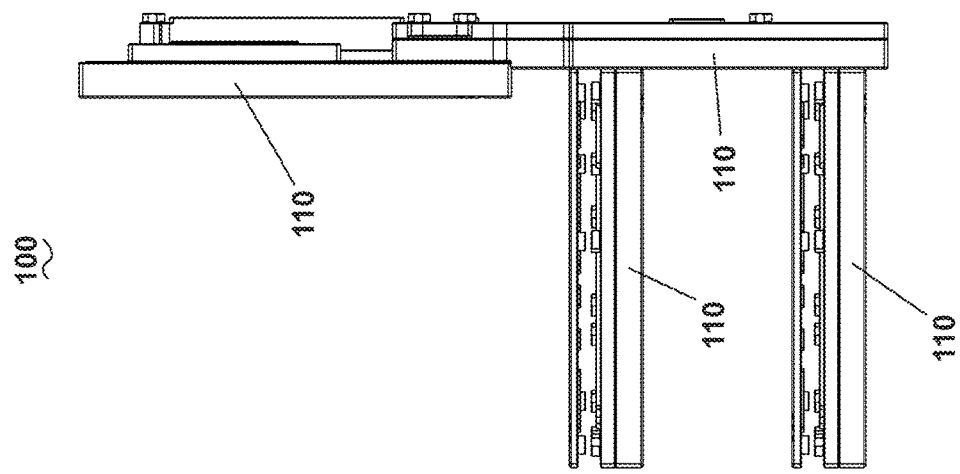
FIG. 15D is another side view of the liquid cooling system of FIG. 15A.
Figure 15C:
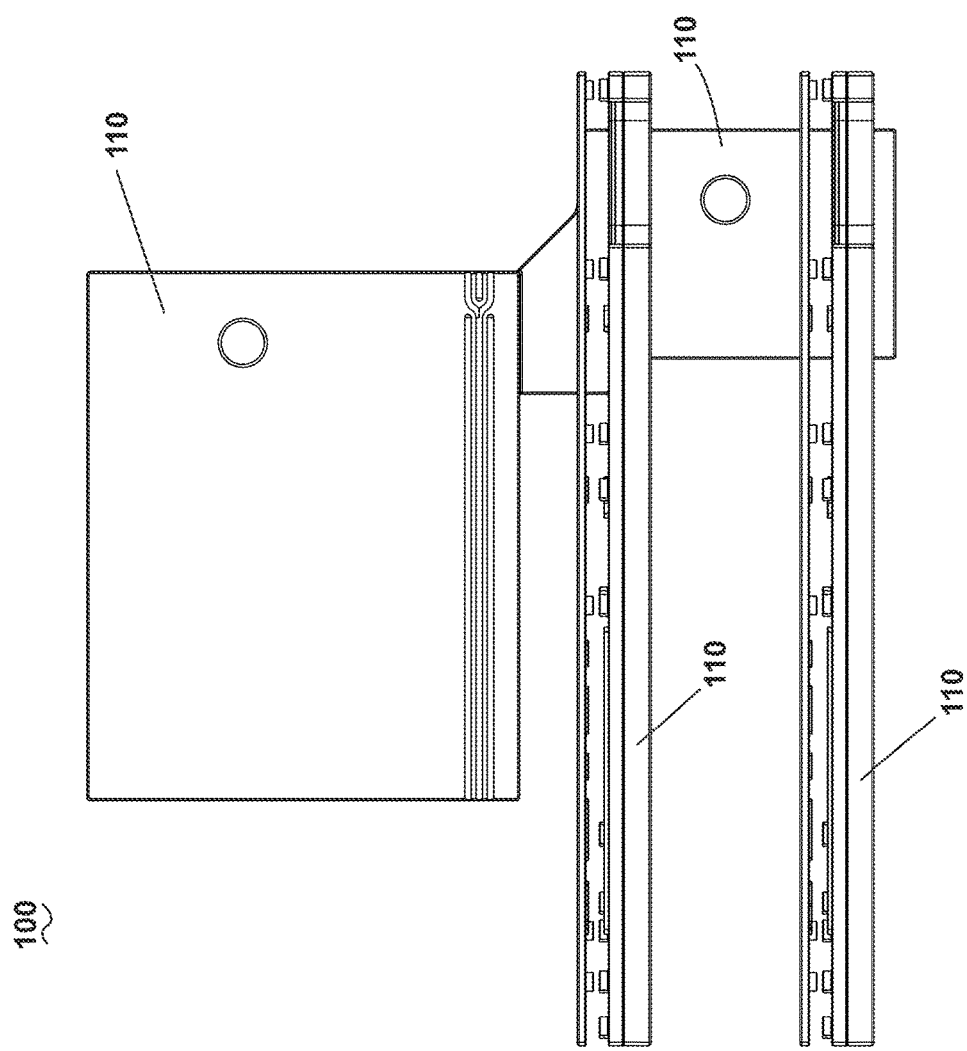
FIG. 15C is a front view of the liquid cooling system of FIG. 15B.
Figure 15E:
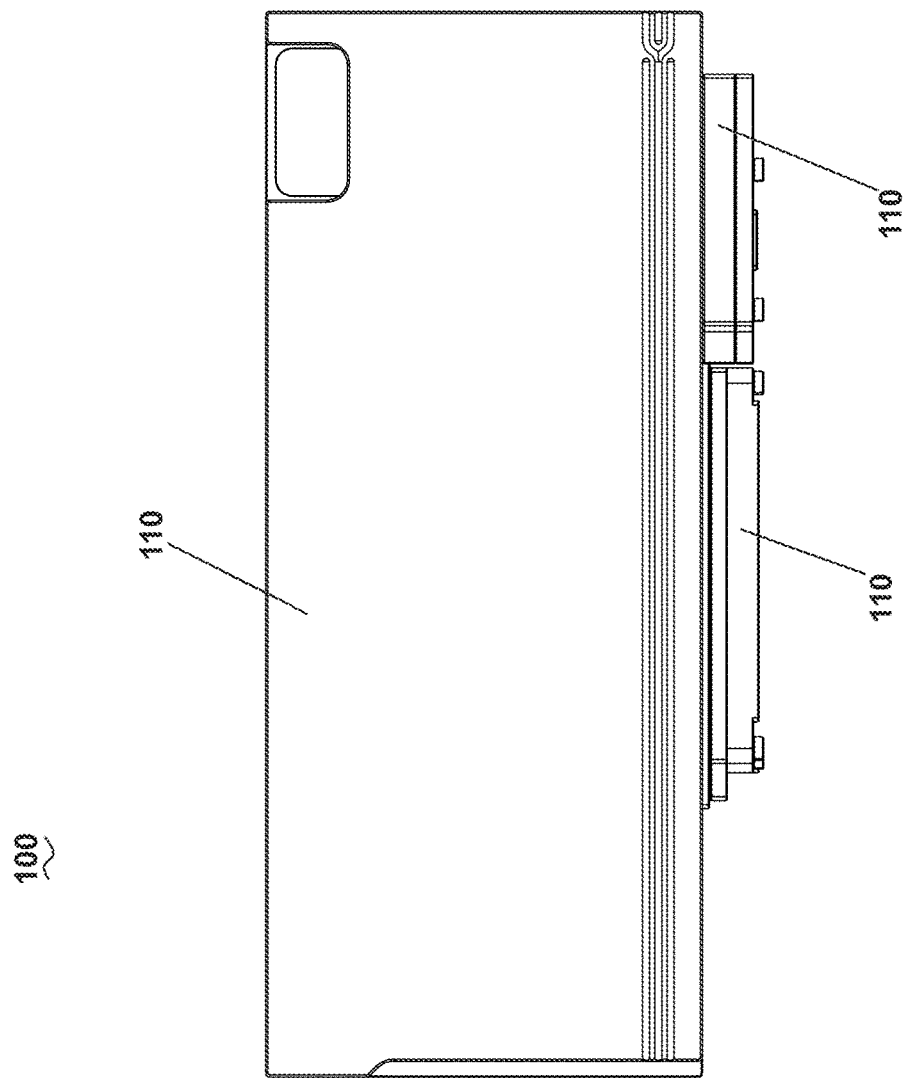
FIG. 15E is a bottom view of the liquid cooling system of FIG. 15A.
Figure 17A:
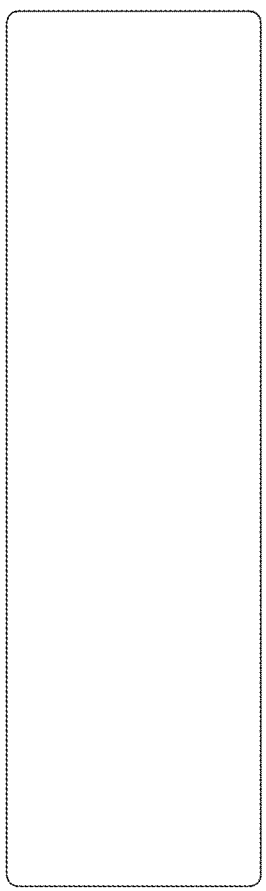
FIG. 17A is a top view of a component for a liquid cooling system.
Figure 17E:
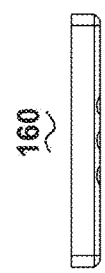
FIG. 17E is a right side view of the component of FIG. 16A.
Figure 17B:
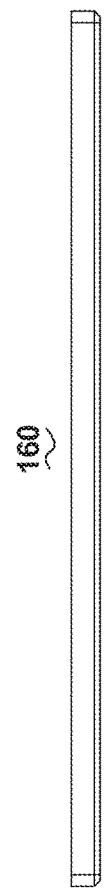
FIG. 17B is a front view of the component of FIG. 16A.
Figure 17D:
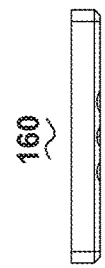
FIG. 17D is a left side view of the component of FIG. 16A.
Figure 17C:
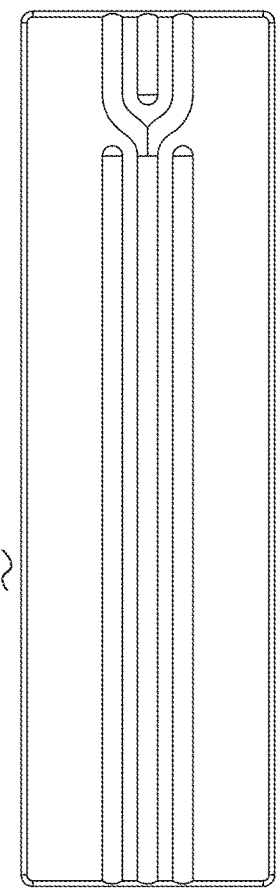
FIG. 17C is a bottom of the component of FIG. 16A.
Figure 19:
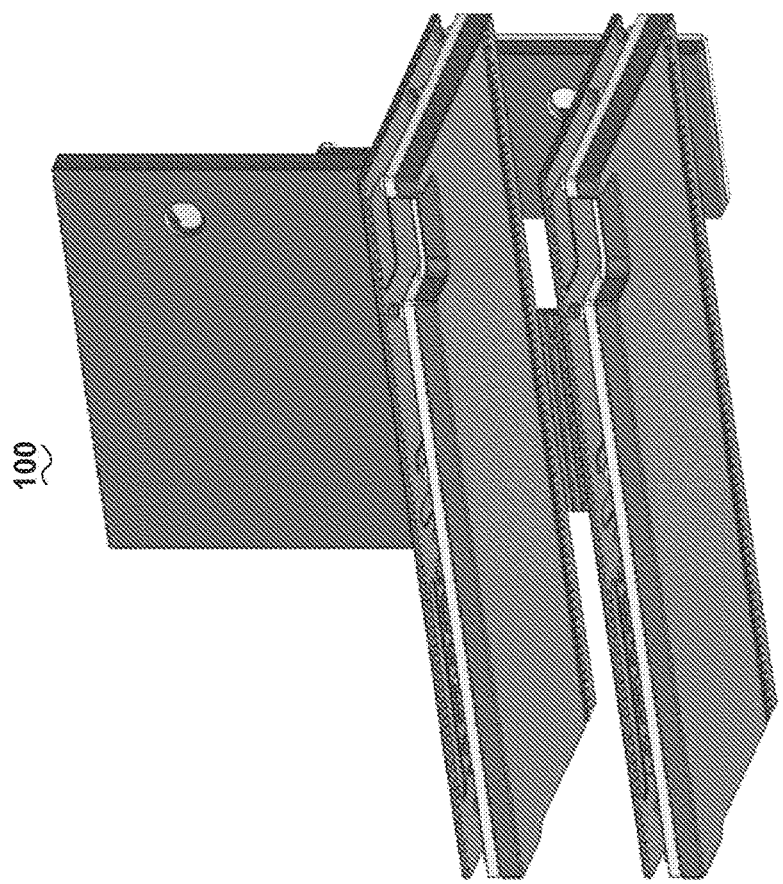
FIG. 19 is a bottom perspective view of a liquid cooling system.
Figure 18:
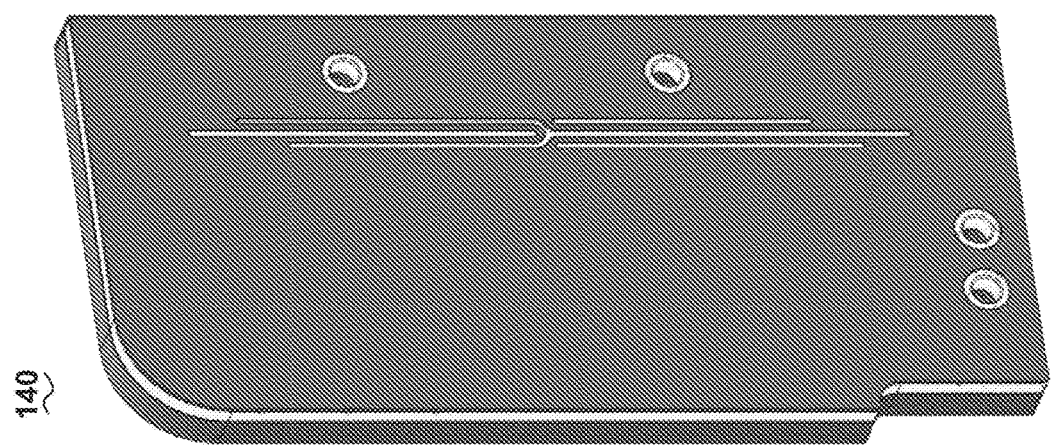
FIG. 18 is a perspective view of a component for a liquid cooling system.

FIGS. 11-14 and 18 illustrate a component block 140 for the liquid cooling system 100, which can be mounted to one or more of the blocks 110 of the liquid cooling system 100. The component block 140 can be generally similar to the blocks 110 as discussed above, but can be additional types of blocks designed to be incorporated into the liquid cooling system 100 to tailor to the particular environment of component the system is cooling. FIG. 14 best illustrates interior cooling conduits 130 having inlets 132 and outlets 134, which are arranged adjacent to the structural interfaces 120. Additionally, the interior cooling conduits 130 can be widened, as shown as a widened conduit 136, covering a larger area of the component to provide local cooling across a wider planar surface, while maintaining the smaller dedicated structural interfaces 120. It should be appreciated that the definition of the inlets 132 and outlets 134 are exemplary, and the inlets and outlets can be defined based upon a particular fluid flow direction through the fluid conduits 130.

FIGS. 16A-16E and 17A-17E illustrate two additional components 150, 160 for a liquid cooling system, with FIGS. 16A-16E including the structural interfaces, as well as some conduits for passing the cooling fluid. FIGS. 17A-17E illustrate another such component, which includes the conduits for passing the cooling fluid. It should be appreciated there are a myriad of combinations of components that can be utilized as blocks 110 or other portions of the liquid cooling assembly 100, which can be utilized to tailor to any number of hot or electronic systems or environments.

Such as system provides for simplifying installation and reducing the occasion of installer-error, as well as failure of the cooling system long-term, increasing overall operation lifetime of the cooling system, as well as the heated environment which it cools. Furthermore, specialist knowledge is not required to install in a secure and consistent manner, and reduces incorrect installation. Furthermore, fitting traditionally required to interconnect fluid tubing is eliminated, further simplifying the assembly, installation, and reducing the potential for leakage, which is particularly important in an electronics environment where a leakage could case damage to the local environment. Furthermore, each block can be secured to the element or component in which it cools. The formed single assembly provides for spreading a weight load across the entire system, where otherwise individualized mounting systems can result in excessive deflection or damage to the components intended to be cooled. The present system reduces the occurrence of such deflection or resulting damage.

The solution disclosed rigidly secures all cooling blocks 110 together into one single assembly 102. The structural interfaces 120 between each component 140 or block 110 can simultaneously be used to connect the fluid conduits 130 to distribute coolant so that one single combined system 100 of blocks 110 can cover all heat producing components in the electrical system or hot environment. The single combined assembly 100 reduces or potentially eliminates the need for fittings to complete the cooling fluid loop. Therefore, assembly time and chance of failure are greatly reduced, which also increases lifetime of the cooling system 100 and the components that it cools. Further yet, this rigid assembly, which mounts among itself and to multiple heat-producing components spreads the weight load, decreasing or eliminating deflection of electrical components, PCB's, and is advantageous for small fragile electrical connections.

To the extent not already described, the different features and structures of the various embodiments of the present disclosure may be used in combination with each other as desired. For example, one or more of the features illustrated and/or described with respect to one of the systems or a component thereof can be used with or combined with one or more features illustrated and/or described with respect to the other of the system or component thereof. That one feature may not be illustrated in all of the embodiments is not meant to be construed that it cannot be, but is done for brevity of description. Thus, the various features of the different embodiments may be mixed and matched as desired to form new embodiments, whether or not the new embodiments are expressly described.

While aspects of the present disclosure have been specifically described in connection with certain specific embodiments thereof, it is to be understood that this is by way of illustration and not of limitation. Reasonable variation and modification are possible within the scope of the forgoing disclosure and drawings without departing from the spirit of the present disclosure which is defined in the appended claims.

What is claimed is:

1. A modular liquid cooling system for cooling electronic components comprising:
multiple blocks including a first block defining a first plane, a second block defining a second plane, and a terminal block defining a third plane, parallel to the first plane and perpendicular to the second plane, with each block including:
a body extending along one of the first plane or the second plane;
a fluid conduit integral with and extending through the body including an inlet and an outlet; and
a structural interface provided on the body at one of the inlet or the outlet, each of the first and second blocks mountable to the terminal block at their corresponding structural interface;
a single looped assembly comprising a loop extending through the fluid conduits of at least the first block, the second block, and the terminal block;
wherein the structural interface provides for both structural connection and fluid communication among the at least two blocks;

wherein the terminal block is for supporting and cooling a motherboard.

2. The modular liquid cooling system of claim 1 wherein the first block includes a cold plate.

3. The modular liquid cooling system of claim 2 wherein the cold plate is configured to cool a CPU.

4. The modular liquid cooling system of claim 1 wherein each block of the at least two blocks includes a set of multiple structural interfaces provided on the body.

5. The modular liquid cooling system of claim 4 wherein each block of the at least two blocks includes at least two fluid conduits, where each inlet and outlet of each fluid conduit includes at least one structural interface of the set of multiple structural interfaces.

6. The modular liquid cooling system of claim 1 wherein the modular liquid cooling system is configured for use in a computer.

7. The modular liquid cooling system of claim 6 wherein each block of the at least two blocks is configured to cool an ATX device or a PCIe device.

8. The modular liquid cooling system of claim 7 wherein one block of the at least two blocks is configured to cool the ATX device and the remaining blocks of the at least two blocks are configured to cool the PCIe device.

9. The modular liquid cooling system of claim 8 wherein the ATX device is the motherboard and the PCIe device is one of a solid state drive, a RAID controller, an optical drive, a hard drive, or a graphics card.

10. A method of cooling an electronic devices of claim 1 including passing a volume of liquid along the fluid conduit.

11. A method of liquid cooling an electronic device, the method comprising:
    providing a terminal block of a modular liquid cooling system including a terminal conduit extending between at least one terminal inlet and at least one terminal outlet, the terminal block defining a terminal plane;
    connecting a first block of the modular liquid cooling system to the terminal block, with the first block including a first conduit having at least a first inlet, the first block defining a first plane parallel to the terminal plane;
    connecting a second block of the modular liquid cooling system to the terminal block, with the second block including a second conduit having at least a second inlet, the second block defining a second plane perpendicular to the terminal plane;
    forming a cooling loop comprising at least the terminal conduit, the first conduit, and the second conduit; and
    passing a liquid from the first conduit via the first outlet to the terminal conduit via the terminal inlet at the connection between the terminal block and the first block and then to the second conduit via the second inlet at the connection between the terminal block and the second block;
    wherein the liquid convectively cools the electronic device by passing the liquid through the cooling loop.

12. The method of claim 11 wherein connecting further includes connecting the first block and the second block at a structural interface that mounts the first block to the second block, as well as fluidly couples the first conduit to the second conduit.

13. The method of claim 11 further comprising connecting at least one additional block to the modular cooling system, with each additional block including at least one additional conduit.

14. The method of claim 13 wherein connecting the at least one additional block includes fluidly coupling the at least one additional conduit to the first conduit and the second conduit.

15. The method of claim 11 further comprising cooling the liquid after the liquid has been passed between the first conduit and the second conduit.

16. A modular liquid cooling system for cooling electronic components comprising:
    a terminal block with interior cooling conduits extending between at least one terminal inlet and multiple terminal outlets and having at least one terminal structural interface;
    a primary block with interior cooling conduits extending between at least one primary inlet and at least one primary outlet and having at least one primary structural interface proximate the at least one primary inlet for mounting the primary block directly to the terminal block at the at least one terminal structural interface to fluidly couple the at least one primary inlet to one of the multiple terminal outlets;
    at least one secondary block with interior cooling conduits extending between a secondary inlet and a secondary outlet, a secondary structural interface adjacent both the secondary inlet and the secondary outlet for mounting the secondary block to the terminal block at another one of the at least one terminal structural interfaces to fluidly couple the secondary inlet to one of the multiple terminal outlets and the secondary outlet to one of the multiple terminal outlets;
    wherein the interior cooling conduits form a single looped assembly having the same flow direction for a cooling fluid throughout a loop extending from the terminal block through the secondary block and back through the terminal block to the primary block for cooling electrical components mounted to the terminal block, the primary block, and the at least one secondary block.

17. The modular liquid cooling system of claim 16 wherein the electrical component mounted to the terminal block is a motherboard.

18. The modular liquid cooling system of claim 16 wherein each of the terminal block, primary block and secondary block extend along different planes, at least two of which are perpendicular to each other or at least two of which are parallel to each other.

19. The modular liquid cooling system of claim 16 wherein the primary block extends along a plane parallel to the terminal block and the secondary block extends along a plane perpendicular to the terminal block.

20. The modular liquid cooling system of claim 16 further comprising a pump for continuously pumping the cooling fluid through the interior cooling conduits.

* * * * *